(12) United States Patent
Chai

(10) Patent No.: US 9,799,247 B2
(45) Date of Patent: Oct. 24, 2017

(54) DISPLAY PANEL

(71) Applicant: SHENZHEN CHINA STAR OPTOELECTRONICS TECHNOLOGY CO., LTD., Shenzhen, Guangdong (CN)

(72) Inventor: Li Chai, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/647,107

(22) PCT Filed: Jan. 20, 2015

(86) PCT No.: PCT/CN2015/071072
§ 371 (c)(1),
(2) Date: May 25, 2015

(87) PCT Pub. No.: WO2015/109986
PCT Pub. Date: Jul. 30, 2015

(65) Prior Publication Data
US 2016/0321971 A1  Nov. 3, 2016

(30) Foreign Application Priority Data

Jan. 21, 2014  (CN) .......................... 2014 1 0028455

(51) Int. Cl.
*H01L 27/14* (2006.01)
*G09G 3/20* (2006.01)
(Continued)

(52) U.S. Cl.
CPC ............. *G09G 3/006* (2013.01); *G09G 3/00* (2013.01); *G09G 3/20* (2013.01); *H01L 27/124* (2013.01);
(Continued)

(58) Field of Classification Search
CPC ... H01L 27/124; H01L 27/14; H01L 27/1446; H01L 27/14649; H01L 31/02162;
(Continued)

(56) References Cited

U.S. PATENT DOCUMENTS 7,098,987 B1 *  8/2006  Jen .................... G02F 1/1309
                                                349/152
2004/0119917 A1 *  6/2004  Lim .................. G02F 1/133512
                                                349/110
(Continued)

FOREIGN PATENT DOCUMENTS

CN          1438521 A       8/2003
CN          1797160 A       7/2006
(Continued)

OTHER PUBLICATIONS

Peian Sun, the International Searching Authority written comments, dated Apr. 2015, CN.

*Primary Examiner* — Fazli Erdem

(57) ABSTRACT

The present invention provides a display panel, which includes a plurality of scanning lines extending along a first direction, a plurality of data lines extending along a second direction and intersecting with the scanning lines, common electrode lines are disposed between two adjacent scanning lines and being parallel to the scanning lines, a wiring area covers the scanning lines, the data lines and the common electrode lines and a plurality of test pins for testing, pixel electrodes connected to corresponding data lines being disposed in each pixel cell, the pixel electrodes of the display pixels and the common electrode lines are separated and insulated, the pixel electrode of the virtual pixels being connected with the common electrode line by a connecting hole, the scanning lines, the data lines and the common
(Continued)

electrode lines being connected respectively with a corresponding test pin by a connecting line in the wring area.

15 Claims, 4 Drawing Sheets

(51) Int. Cl.
    *G09G 3/00*         (2006.01)
    *H01L 27/12*       (2006.01)
    *G02F 1/1333*     (2006.01)
    *G02F 1/1362*     (2006.01)

(52) U.S. Cl.
    CPC ............ *G02F 2001/133388* (2013.01); *G02F 2001/136254* (2013.01); *G09G 2300/0413* (2013.01); *G09G 2300/0426* (2013.01)

(58) Field of Classification Search
    CPC ......... H01L 31/02164; H01L 31/03046; H01L 31/109; G09G 3/006; G09G 3/009; G09G 3/20; G02F 2001/133388
    See application file for complete search history.

(56) References Cited

U.S. PATENT DOCUMENTS

| | | | |
|---|---|---|---|
| 2004/0218076 A1* | 11/2004 | Lee ................ | H01L 27/0207 348/294 |
| 2007/0075936 A1* | 4/2007 | Kim ................ | G09G 3/006 345/76 |
| 2009/0206334 A1* | 8/2009 | Yoon ............... | G09G 3/006 257/48 |
| 2010/0187538 A1 | 7/2010 | Koo et al. | |
| 2012/0138926 A1* | 6/2012 | Qin ................. | G01R 31/2884 257/48 |
| 2013/0155037 A1* | 6/2013 | Kim ................ | G09G 3/3225 345/204 |
| 2013/0229589 A1* | 9/2013 | Won ............... | G02F 1/1368 349/43 |
| 2016/0204181 A1* | 7/2016 | So ................. | H01L 27/3276 257/40 |

FOREIGN PATENT DOCUMENTS

| | | |
|---|---|---|
| CN | ON1881015 A | 12/2006 |
| CN | 101515102 A | 8/2009 |
| CN | 202837763 U | 3/2013 |
| CN | 103034003 A | 4/2013 |
| CN | 103268879 A | 8/2013 |
| CN | 103337510 A | 10/2013 |
| CN | 103474396 A | 12/2013 |
| CN | 103761935 A | 4/2014 |

\* cited by examiner

DISPLAY PANEL

FIELD OF THE INVENTION

The present invention relates to a display panel, and more particularly to a testing circuit configuration of the panel display.

BACKGROUND OF THE INVENTION

In general, testing pins are disposed on a display panel in an edge area of the panel to test electrical characteristics of panel lines. However, most of such testing pins on the existing display panel are disposed outside of an active film forming area, and the electrical characteristics are quite different with that of the lines inside the active film forming area, which leads to unreliable testing result.

Therefore, it needs a line repairing method and structure to solve the above-mentioned problem.

SUMMARY OF THE INVENTION

On account of the lack of the prior art, the object of the present invention is to provide a display panel, which comprises a plurality of scanning lines extending along a first direction, a plurality of data lines extend along a second direction and intersect with the scanning lines, common electrode lines are disposed between two adjacent scanning lines and are parallel to the scanning lines, a wiring area covers the scanning lines, the data lines and the common electrode lines and a plurality of test pins for testing. The scanning lines and the data lines define a plurality of pixel cells arranged in a matrix form. Pixel electrodes connected to corresponding data lines are disposed in each pixel cell. The pixel cell comprises display pixels in the display area to display images and virtual pixels located at the edge of the display area. The pixel electrodes of the display pixels and the common electrode lines are separated and insulated from each other. The pixel electrode of the virtual pixels is connected with the common electrode line by a connecting hole. The scanning lines, the data lines and the common electrode lines are connected respectively with a corresponding test pin by a connecting line in the wring area.

Wherein, a thin film transistor is disposed at the intersection of the scanning line and the data line in each pixel cell. The thin film transistor comprises a gate which is connected to the scanning line, a gate insulating layer is disposed on the gate, a semiconductor layer is disposed on the gate insulating layer, a source and a drain are electrically connected respectively to the source and the drain of the semiconductor layer and a passivation layer covers the source and the drain.

Wherein, a concave hole is disposed between the source and the drain and extends inwardly until the semiconductor layer, the passivation layer is filled into the concave hole to insulate the source and the drain, an end of the source is connected to the data line, another end is connected to the drain by the semiconductor layer, and an end of the drain opposing to the semiconductor layer is connected to the pixel electrode.

Wherein an ohmic contact layer is disposed between the source, the drain and the semiconductor layer.

Wherein connecting holes are provided on the gate insulating layer and the passivation layer which cover the common electrode lines in the virtual pixel to correspond to the common electrode line, the pixel electrode of the virtual pixel is connected to the common electrode by the connecting hole.

Wherein materials of the gate insulating layer and the passivation layer are silicon nitride compound, and material of the semiconductor layer is amorphous silicon.

Wherein the test pins comprise odd-numbered dummy scanning pins being connected to the scanning lines of the virtual pixels on odd-numbered rows, even-numbered dummy scanning pins being connected to the scanning lines of the virtual pixels on even-numbered rows, odd-numbered dummy data pins being connected to the data lines of the virtual pixels on odd-numbered columns, even-numbered dummy data pins being connected to the data lines of the virtual pixels on even-numbered columns, odd-numbered display scanning pins being connected to the scanning lines of the display pixels on odd-numbered rows, even-numbered display scanning pins being connected to the scanning lines of the display pixels on even-numbered rows, red data pins being connected to the data lines transmitting red display signals, green data pins being connected to the data lines transmitting green display signals, blue data pins being connected to the data lines transmitting blue display signals and common pins connecting to the common electrode lines.

Wherein the virtual pixels comprise first virtual pixels, second virtual pixels, third virtual pixels and forth virtual pixels which are disposed respectively at the four corners of the display area, scanning lines of the first virtual pixels are connected to the odd-numbered dummy data pins, data lines of the first virtual pixels are connected to the even-numbered dummy data pins, common electrode lines of the first virtual pixels are connected to the common pins, scanning lines of the second virtual pixels are connected to the even-numbered dummy data pins, data lines of the second virtual pixels are connected to the even-numbered dummy data pins, common electrode lines of the second virtual pixels are connected to the common pins, scanning lines of the third virtual pixels are connected to the even-numbered dummy data pins, data lines of the third virtual pixels are connected to the odd-numbered dummy data pins, common electrode lines of the third virtual pixels are connected to the common pins.

Wherein the virtual pixels comprise a first virtual pixel group and a second virtual pixel group disposed respectively along edges of two long parallel sides of the display area, the first virtual pixel group and the second virtual pixel group comprise respectively a plurality of virtual pixels arranged in order, the virtual pixels of the first virtual pixel group share the same scanning line and are connected to the odd-numbered dummy scanning pins, the data lines of the virtual pixels in the first virtual pixel group are connected respectively to the red data pins, the green data pins or the blue data pins, the common electrode lines of the virtual pixels in the first virtual pixel group are connected to the common pins, a plurality of virtual pixels of the second virtual pixel group share the same scanning line and are connected to the even-numbered dummy scanning pins, the data lines of the virtual pixels in the second virtual pixel group are connected respectively to the red data pins, the green data pins or the blue data pins, the common electrode lines of the virtual pixels in the first virtual pixel group are connected to the common pins.

Wherein the virtual pixels comprise a third virtual pixel group and a forth virtual pixel group which are disposed respectively along edges of two short parallel sides of the display area, the third virtual pixel group and the forth virtual pixel group comprise respectively a plurality of virtual pixels arranged in order, a plurality of virtual pixels of the third virtual pixel group share the same scanning line and are connected to the odd-numbered dummy scanning pins or the even-numbered dummy scanning pins, the data lines of the virtual pixels in the third virtual pixel group are connected to the even-numbered dummy data pins, the common electrode lines of the virtual pixels in the third virtual pixel group are connected to the common pins, a plurality of virtual pixels of the forth virtual pixel group share the same scanning line and are connected to the odd-numbered dummy scanning pins or the even-numbered dummy scanning pins, the data lines of the virtual pixels in the forth virtual pixel group are connected to the even-numbered dummy data pins, the common electrode lines of the virtual pixels in the forth virtual pixel group are connected to the common pins.

The corresponding virtual pixels in the display area could be flexibly selected by collating different testing pins according to the display panel of the present embodiment. Moreover, the pixel electrode and the common electrode line are connected by perforating in the virtual pixels, so that the electric signals of the pixel unit in the display area could be tested with only the pins in the periphery.

BRIEF DESCRIPTION OF THE DRAWINGS

The drawings briefly described herein are applied for embodiment or prior arts to more clearly illustrate technical solutions of the embodiment of the present invention or the prior arts, apparently, the following drawings are only some embodiment of the present invention, for those of ordinary skills, other drawings could be obtained according the drawings without creative efforts.

DETAILED DESCRIPTION OF THE PREFERRED EMBODIMENTS

Technical solutions of embodiment of the present invention will be clearly and completely described by incorporating the drawings. Obviously, the described embodiment are merely part of embodiment of the present invention, but not all embodiment. Based on the embodiment of the present invention, all other embodiment obtained by those of ordinary skills without creative efforts are in the scope of the present invention.

Figure 1:
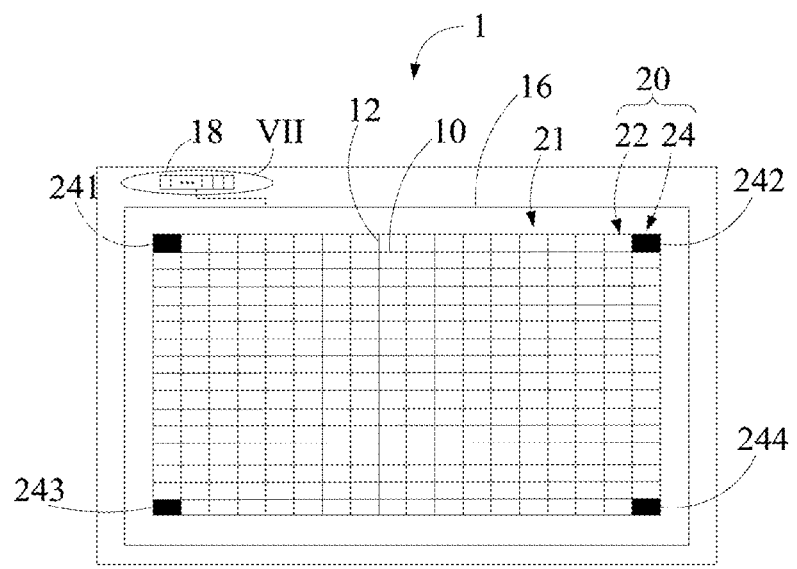
FIG. 1 is a schematic diagram of a display panel according to a first embodiment of the invention.
Figure 2:
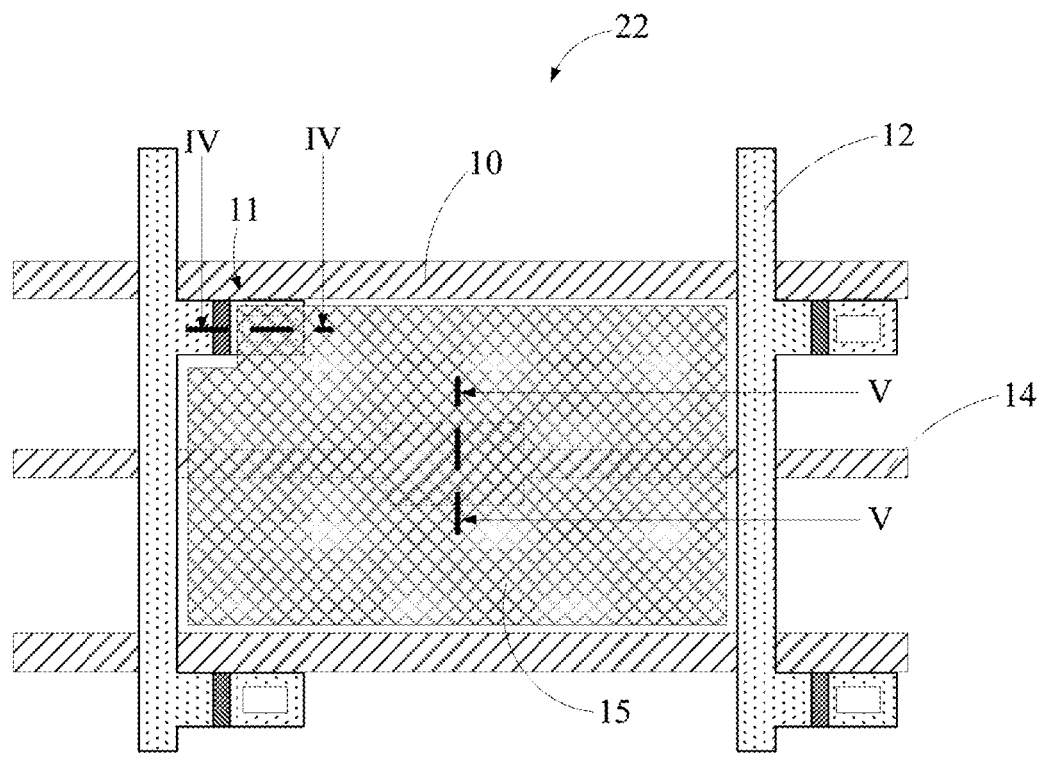
FIG. 2 is a schematic diagram of the display pixels of the FIG. 1.
Figure 3:
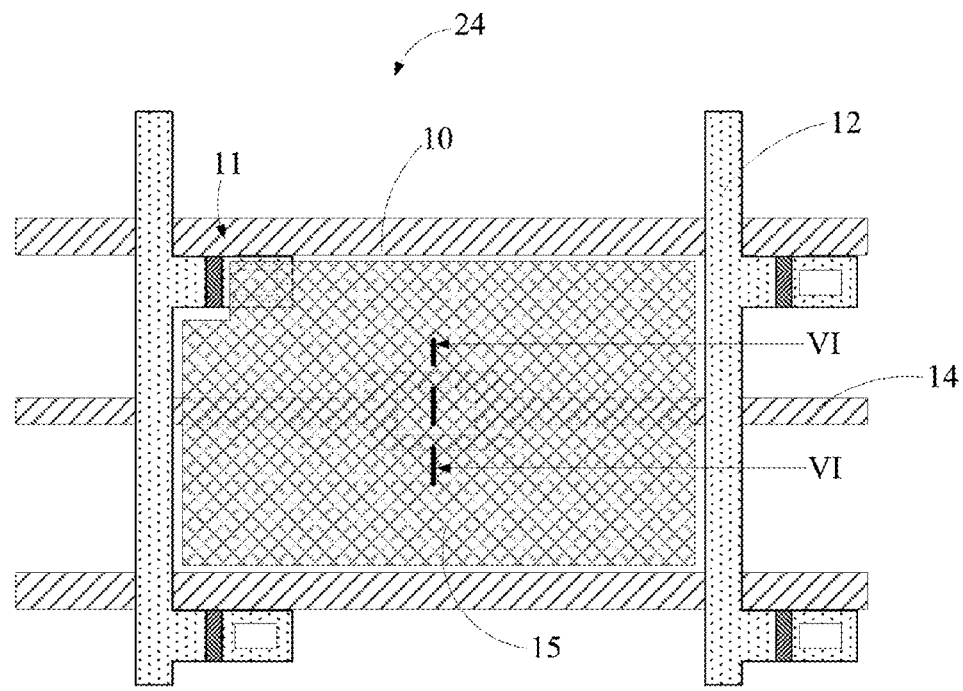
FIG. 3 is a schematic diagram of the virtual pixels of the FIG. 1.

Please refer to FIGS. 1, 2 and 3, a display panel 1 of the first embodiment of the present invention includes a plurality of scanning lines 10 extending along a first direction, a plurality of data lines 12 extending along a second direction and intersecting with the scanning lines 10, common electrode lines 14 being disposed between two adjacent scanning lines and parallel to the scanning lines, a wiring area 16 covering the scanning lines 10, the data lines 12 and the common electrode lines 14 and a plurality of test pins 18 for testing. The scanning lines 10 and the data lines 12 define a plurality of pixel cells 20 arranged in a matrix form. Pixel electrodes 15 connected to corresponding data lines 12 are disposed in each pixel cell 20. The pixel cell 20 includes display pixels 22 in the display area for displaying images and virtual pixels 24 located at the edge of the display area. The pixel electrodes 15 of the display pixels 22 and the common electrode lines 14 are insulated from each other by intervals. The pixel electrode 15 of the virtual pixels 24 is connected with the common electrode line 14 by a connecting hole. The scanning lines 10, the data lines 12 and the common electrode lines 14 are connected respectively with a corresponding test pin 18 by a connecting line in the wring area 16. In the present embodiment, the display panel 1 is an array substrate of the Thin Film Transistor, TFT.

Figure 4:
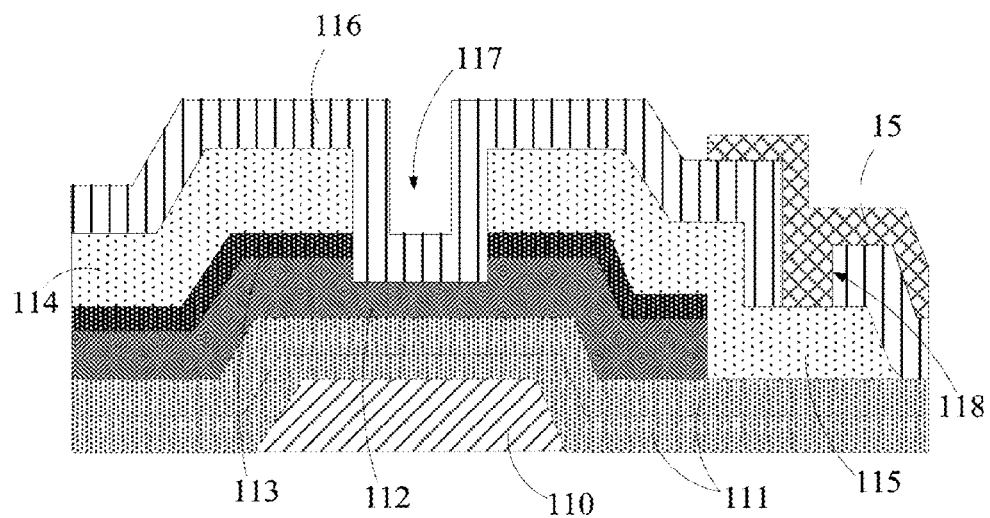
FIG. 4 is a cross-sectional view taken along the line IV-IV of the FIG. 2.

Please refer to FIG. 4, a TFT structure 11 is disposed at the intersection of the scanning line 10 and the data line 12 in each pixel cell 20. The TFT structure 11 includes a gate 110, a gate insulating layer 111, a semiconductor layer 112, an Ohmic contact layer 113, a source 114 and a drain 115 and a passivation layer 116. The gate 110 is connected to the scanning lines 10. The gate insulating layer 111 is disposed on the gate 110. The semiconductor layer 112 is disposed on the gate insulating layer 111. The Ohmic contact layer 113 is disposed on the semiconductor layer 112. A conducting layer is laid on the Ohmic contact layer 113, and a concave hole 117 is disposed the conducting layer and extends inwardly until the semiconductor layer 112 to separate the conducting layer into the source 114 and the drain 115. An end of the source 114 is connected to the data line 12, and another end is connected to the drain 115 by the semiconductor layer 112. The passivation layer 116 covers the conducting layer and is filled into the concave hole 117 to insulate the source 114 and the drain 115. A through hole 118 is disposed on another side of the passivation layer 116 opposing to the semiconductor layer 112 and corresponding to the drain 115, and an end of the pixel electrode 15 is connected to the drain 115 by the through hole 118.

In the present embodiment, the gate insulating layer 111 has two layers. Materials of the gate insulating layer 111 and the passivation layer 116 are silicon nitride compound. Material of the semiconductor layer 112 is amorphous silicon. It would be appreciated that the material of the semiconductor layer 112 may also be polysilicon in other embodiment.

Figure 5:
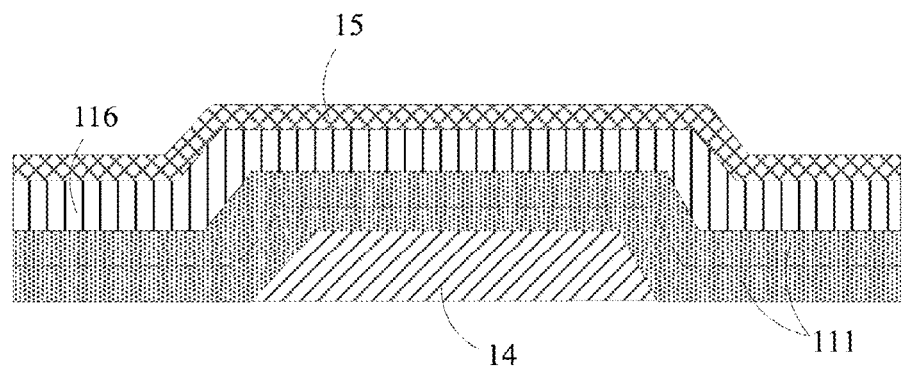
FIG. 5 is a cross-sectional view taken along the line V-V of the FIG. 2.
Figure 6:
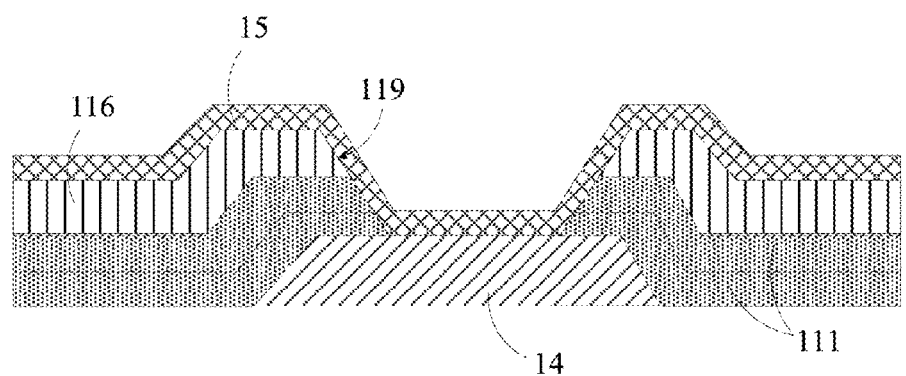
FIG. 6 is a cross-sectional view taken along the line VI-VI of the FIG. 2.

Please refer to FIGS. 5 and 6, the middle of each pixel cell 20 passes through the common electrode line 14 in a direction parallel to the scanning line 10. The gate insulating layer 111 inside the display pixels 22 extends and covers the common electrode line 14. The passivation layer 116 located inside the display pixels 22 extends and covers the gate insulating layer 111. The pixel electrode 15 located inside the display pixels 22 is disposed on the passivation layer 116 and isolates from the common electrode line 14. Connecting holes 119 are disposed respectively on the gate insulating layer 111 and the passivation layer 116 covering the common electrode line 14 in the virtual pixels 24 to correspond with the common electrode line 14. The pixel electrode 15 located inside the virtual pixels 24 is connected to the common electrode via the connecting holes 119. In the present embodiment, the form of the display area 21 is rectangular which locates at the center of a display panel 1. The pixel cells 20 located inside the display area 21 is display pixels 22. The virtual pixels 24 include first virtual pixels 241, second virtual pixels 242, third virtual pixels 243 and forth virtual pixels 244 disposed respectively at the four corners of the display area 21.

Figure 7:
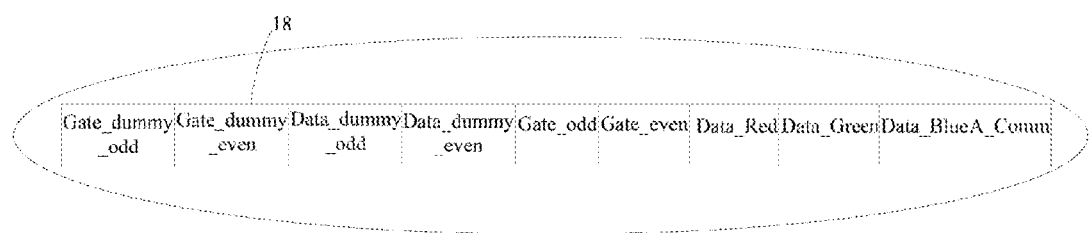
FIG. 7 is an enlarged view of part VII of the FIG. 1.

Please refer to FIG. 7, the test pins 18 includes odd-numbered dummy scanning pins gate_dummy_odd connecting to the scanning lines 10 of the virtual pixels 24 on odd-numbered rows, even-numbered dummy scanning pins gate_dummy_even connecting to the scanning lines 10 of the virtual pixels 24 on even-numbered rows, odd-numbered dummy data pins data_dummy_odd connecting to the data lines 12 of the virtual pixels 24 on odd-numbered columns, even-numbered dummy data pins data_dummy_even connecting to the data lines 12 of the virtual pixels 24 on even-numbered columns, odd-numbered display scanning pins gate_odd connecting to the scanning lines 10 of the display pixels 22 on odd-numbered rows, even-numbered display scanning pins gate_even connecting to the scanning lines 10 of the display pixels 22 on even-numbered rows, red data pins data_red connecting to the data lines 12 transmitting red display signals, green data pins data_green connecting to the data lines 12 transmitting green display signals, blue data pins data_blue connecting to the data lines 12 transmitting blue display signals and common pins A_comm connecting to the common electrode lines 14.

The scanning lines 10 of the first virtual pixels 241 are connected to the odd-numbered dummy data pins data_dummy_odd. The data lines 12 of the first virtual pixels 241 are connected to the even-numbered dummy data pins data_dummy_even. The common electrode lines 14 of the first virtual pixels 241 are connected to the common pins A_comm. The scanning lines 10 of the second virtual pixels 242 are connected to the even-numbered dummy data pins data_dummy_even. The data lines 12 of the second virtual pixels 242 are connected to the even-numbered dummy data pins data_dummy_even. The common electrode lines 14 of the second virtual pixels 242 are connected to the common pins A_comm. The scanning lines 10 of the third virtual pixels 243 are connected to the even-numbered dummy data pins data_dummy_even. The data lines 12 of the third virtual pixels 243 are connected to the odd-numbered dummy data pins data_dummy_odd. The common electrode lines 14 of the third virtual pixels 243 are connected to the common pins A_comm. The scanning lines 10 of the forth virtual pixels 244 are connected to the even-numbered dummy scanning pins gate_dummy_odd. The data lines 12 of the forth virtual pixels 244 are connected to the odd-numbered dummy data pins data_dummy_odd. The common electrode lines 14 of the forth virtual pixels 244 are connected to the common pins A_comm. Because the pixel electrode 15 of the virtual pixels 24 is connected to the common electrode lines 14, the corresponding virtual pixels 24 could be selected by testing different combinations of the odd/even dummy scanning pins and odd/even dummy data pins and then to input the testing signals. The testing signals received on the pixel electrode 15 of the virtual pixels 24 could be detected by the common pins A_comm connected with the common electrode lines 14 of the virtual pixels 24, therefor to determine the electrical quality of the display pixel 22 manufactured by the same process as that of the virtual pixels 24.

Figure 8:
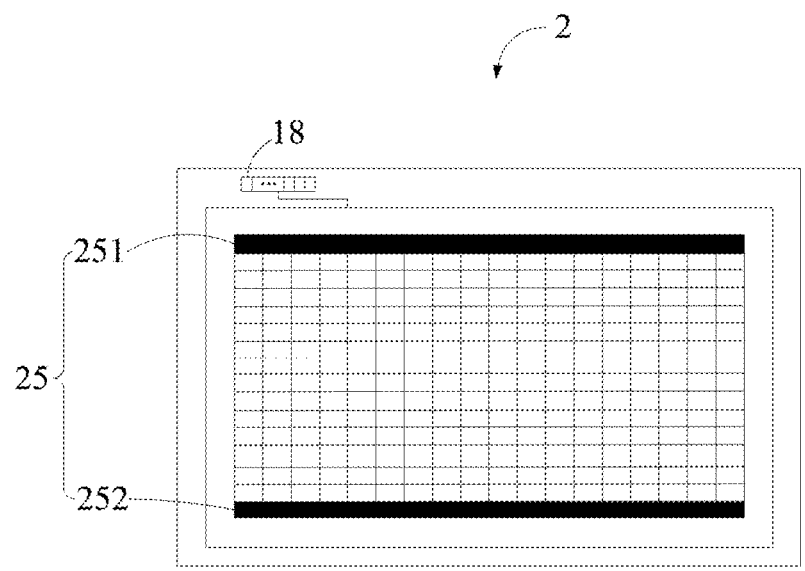
FIG. 8 is a schematic diagram of a display panel according to a second embodiment of the invention.

Please refer to FIG. 8, the structure of the display panel 2 of the second embodiment of the present invention is basically the same as that of the display panel 1 of the first embodiment except that the virtual pixels 25 includes a first virtual pixel group 251 and a second virtual pixel group 252 disposed respectively along edges of two long parallel sides of the display area 26. The first virtual pixel group 251 and the second virtual pixel group 252 includes respectively a plurality of virtual pixels 25 arranged in order. A plurality of virtual pixels 25 of the first virtual pixel group 251 share the same scanning line 10 and are connected to the odd-numbered dummy scanning pins gate_dummy_odd. The data lines 12 of the virtual pixels 25 in the first virtual pixel group 251 are connected respectively to the red data pins data_red, the green data pins data_green, the blue data pins data_blue. The common electrode lines 14 of the virtual pixels 25 in the first virtual pixel group 251 is connected to the common pins A_comm. A plurality of virtual pixels 25 of the second virtual pixel group 252 share the same scanning line 10 and are connected to the even-numbered dummy scanning pins gate_dummy_even. The data lines 12 of the virtual pixels in the second virtual pixel group 252 are connected respectively to the red data pins data_red, the green data pins data_green, the blue data pins data_blue. The common electrode lines 14 of the virtual pixels 25 in the second virtual pixel group 252 is connected to the common pins A_comm. Average electrical values of the two group of the virtual pixels 25 disposed along the longitudinal direction of the display panel 2 could be detected by switching odd/even dummy scanning pins according to the second embodiment of the present invention.

Figure 9:
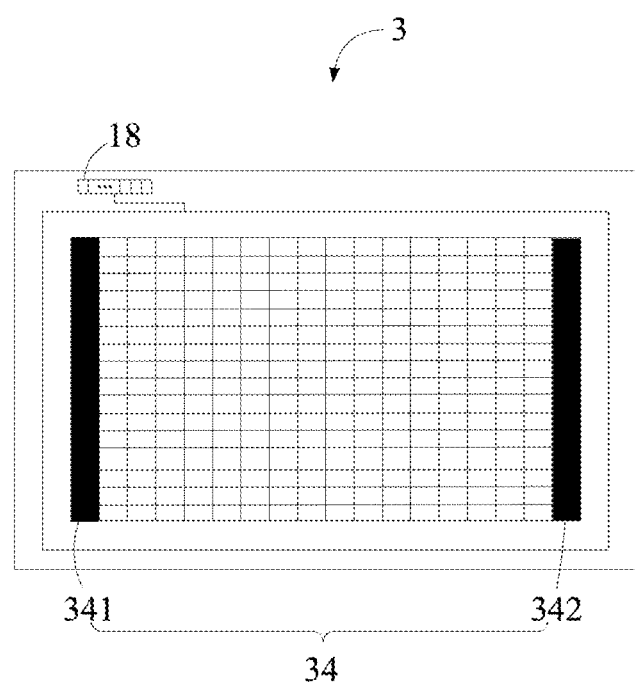
FIG. 9 is a schematic diagram of a display panel according to a third embodiment of the invention.

Please refer to FIG. 9, the structure of the display panel 3 of the third embodiment of the present invention is basically the same as that of the display panel 1 of the first embodiment except that the virtual pixels 34 includes a third virtual pixel group 341 and a forth virtual pixel group 342 disposed respectively along edges of two short parallel sides of the display area 34. The third virtual pixel group 341 and the forth virtual pixel group 342 includes respectively a plurality of virtual pixels 34 arranged in order. A plurality of virtual pixels 34 of the third virtual pixel group 341 share the same scanning line 10 and are connected to the odd-numbered dummy scanning pins gate_dummy_odd or the even-numbered dummy scanning pins gate_dummy_even. The data lines 12 of the virtual pixels 34 in the third virtual pixel group 341 are connected to the even-numbered dummy data pins data_dummy_even. The common electrode lines 14 of the virtual pixels 34 in the third virtual pixel group 341 is connected to the common pins A_comm. A plurality of virtual pixels 34 of the forth virtual pixel group 342 share the same scanning line 10 and are connected to the odd-numbered dummy scanning pins gate_dummy_odd or the even-numbered dummy scanning pins gate_dummy_even. The data lines 12 of the virtual pixels 34 in the forth virtual pixel group 342 are connected to the even-numbered dummy data pins data_dummy_even. The common electrode lines 14 of the virtual pixels 34 in the forth virtual pixel group 342 is connected to the common pins A_comm. Average electrical values of the two group of the virtual pixels 34 disposed along the short sides of the display panel 3 could be detected by switching odd/even dummy scanning pins according to the third embodiment of the present invention.

The corresponding virtual pixels 24 in the display area 21 could be flexibly selected by collating different testing pins 18 according to the display panel 1 of the present embodiment. Moreover, the pixel electrode 15 and the common electrode line 14 are connected by perforating in the virtual pixels 24, so that the electric signals of the pixel unit 20 in the display area 21 could be tested with only the pins in the periphery.

Which is disclosed above is only a preferred embodiment of the present invention and certainly not in order to limit the scope of the invention, therefore, equivalent variations according to the claims of the present invention will be still covered by the scope of the present invention.

What is claimed is:

1. A display panel, comprising a plurality of scanning lines extending along a first direction, a plurality of data lines extending along a second direction and intersecting with the scanning lines, common electrode lines being disposed between two adjacent scanning lines and being parallel to the scanning lines, a wiring area covering the scanning lines, the data lines and the common electrode lines and a plurality of test pins for testing, said scanning lines and said data lines define a plurality of pixel cells arranged in a matrix form, pixel electrodes connected to corresponding data lines being disposed in each pixel cell, said pixel cell comprising display pixels in the display area for displaying images and virtual pixels located at the edge of the display area, the pixel electrodes of the display pixels and the common electrode lines being separated and insulated from each other, said pixel electrode of the virtual pixels being connected with the common electrode line by a connecting hole, said scanning lines, said data lines and said common electrode lines being connected respectively with a corresponding test pin by a connecting line in the wiring area.

2. The display panel according to claim 1, wherein a thin film transistor is disposed at the intersection of the scanning line and the data line in each pixel cell, the thin film transistor comprises a gate connected to the scanning line, a gate insulating layer is disposed on the gate, a semiconductor layer is disposed on the gate insulating layer, a source and a drain are electrically connected respectively to the source and the drain of the semiconductor layer and a passivation layer covers the source and the drain.

3. The display panel according to claim 2, wherein a concave hole is disposed between the source and the drain and extends inwardly until said semiconductor layer, the passivation layer is filled into the concave hole to insulate the source and the drain, an end of the source is connected to the data line, another end of the source is connected to the drain by the semiconductor layer, and an end of the drain opposing to the semiconductor layer is connected to the pixel electrode.

4. The display panel according to claim 2, wherein an ohmic contact layer is disposed between the source, the drain and the semiconductor layer.

5. The display panel according to claim 2, wherein connecting holes are provided on the gate insulating layer and the passivation layer which cover the common electrode lines in the virtual pixel to correspond to the common electrode line, the pixel electrode of the virtual pixel is connected to the common electrode by the connecting hole.

6. The display panel according to claim 2, wherein materials of the gate insulating layer and the passivation layer are silicon nitride compound, and material of the semiconductor layer is amorphous silicon.

7. The display panel according to claim 1, wherein the test pins comprise odd-numbered dummy scanning pins being connected to the scanning lines of the virtual pixels on odd-numbered rows, even-numbered dummy scanning pins being connected to the scanning lines of the virtual pixels on even-numbered rows, odd-numbered dummy data pins being connected to the data lines of the virtual pixels on odd-numbered columns, even-numbered dummy data pins being connected to the data lines of the virtual pixels on even-numbered columns, odd-numbered display scanning pins being connected to the scanning lines of the display pixels on odd-numbered rows, even-numbered display scanning pins being connected to the scanning lines of the display pixels on even-numbered rows, red data pins being connected to the data lines transmitting red display signals, green data pins being connected to the data lines transmitting green display signals, blue data pins being connected to the data lines transmitting blue display signals and common pins connecting to the common electrode lines.

8. The display panel according to claim 2, wherein the test pins comprise odd-numbered dummy scanning pins being connected to the scanning lines of the virtual pixels on odd-numbered rows, even-numbered dummy scanning pins being connected to the scanning lines of the virtual pixels on even-numbered rows, odd-numbered dummy data pins being connected to the data lines of the virtual pixels on odd-numbered columns, even-numbered dummy data pins being connected to the data lines of the virtual pixels on even-numbered columns, odd-numbered display scanning pins being connected to the scanning lines of the display pixels on odd-numbered rows, even-numbered display scanning pins being connected to the scanning lines of the display pixels on even-numbered rows, red data pins being connected to the data lines transmitting red display signals, green data pins being connected to the data lines transmitting green display signals, blue data pins being connected to the data lines transmitting blue display signals and common pins connecting to the common electrode lines.

9. The display panel according to claim 3, wherein the test pins comprise odd-numbered dummy scanning pins being connected to the scanning lines of the virtual pixels on odd-numbered rows, even-numbered dummy scanning pins being connected to the scanning lines of the virtual pixels on even-numbered rows, odd-numbered dummy data pins being connected to the data lines of the virtual pixels on odd-numbered columns, even-numbered dummy data pins being connected to the data lines of the virtual pixels on even-numbered columns, odd-numbered display scanning pins being connected to the scanning lines of the display pixels on odd-numbered rows, even-numbered display scanning pins being connected to the scanning lines of the display pixels on even-numbered rows, red data pins being connected to the data lines transmitting red display signals, green data pins being connected to the data lines transmitting green display signals, blue data pins being connected to the data lines transmitting blue display signals and common pins connecting to the common electrode lines.

10. The display panel according to claim 4, wherein the test pins comprise odd-numbered dummy scanning pins being connected to the scanning lines of the virtual pixels on odd-numbered rows, even-numbered dummy scanning pins being connected to the scanning lines of the virtual pixels on even-numbered rows, odd-numbered dummy data pins being connected to the data lines of the virtual pixels on odd-numbered columns, even-numbered dummy data pins being connected to the data lines of the virtual pixels on even-numbered columns, odd-numbered display scanning pins being connected to the scanning lines of the display pixels on odd-numbered rows, even-numbered display scanning pins being connected to the scanning lines of the display pixels on even-numbered rows, red data pins being connected to the data lines transmitting red display signals, green data pins being connected to the data lines transmitting green display signals, blue data pins being connected to the data lines transmitting blue display signals and common pins connecting to the common electrode lines.

11. The display panel according to claim 5, wherein the test pins comprise odd-numbered dummy scanning pins being connected to the scanning lines of the virtual pixels on odd-numbered rows, even-numbered dummy scanning pins being connected to the scanning lines of the virtual pixels on even-numbered rows, odd-numbered dummy data pins being connected to the data lines of the virtual pixels on odd-numbered columns, even-numbered dummy data pins being connected to the data lines of the virtual pixels on even-numbered columns, odd-numbered display scanning pins being connected to the scanning lines of the display pixels on odd-numbered rows, even-numbered display scanning pins being connected to the scanning lines of the display pixels on even-numbered rows, red data pins being connected to the data lines transmitting red display signals, green data pins being connected to the data lines transmitting green display signals, blue data pins being connected to the data lines transmitting blue display signals and common pins connecting to the common electrode lines.

12. The display panel according to claim 6, wherein the test pins comprise odd-numbered dummy scanning pins being connected to the scanning lines of the virtual pixels on odd-numbered rows, even-numbered dummy scanning pins being connected to the scanning lines of the virtual pixels on even-numbered rows, odd-numbered dummy data pins being connected to the data lines of the virtual pixels on odd-numbered columns, even-numbered dummy data pins being connected to the data lines of the virtual pixels on even-numbered columns, odd-numbered display scanning pins being connected to the scanning lines of the display pixels on odd-numbered rows, even-numbered display scanning pins being connected to the scanning lines of the display pixels on even-numbered rows, red data pins being connected to the data lines transmitting red display signals, green data pins being connected to the data lines transmitting green display signals, blue data pins being connected to the data lines transmitting blue display signals and common pins connecting to the common electrode lines.

13. The display panel according to claim 7, wherein the virtual pixels comprise first virtual pixels, second virtual pixels, third virtual pixels and forth virtual pixels disposed respectively at the four corners of the display area, and wherein scanning lines of the first virtual pixels are connected to the odd-numbered dummy data pins, data lines of the first virtual pixels are connected to the even-numbered dummy data pins, common electrode lines of the first virtual pixels are connected to the common pins, scanning lines of the second virtual pixels are connected to the even-numbered dummy data pins, data lines of the second virtual pixels are connected to the even-numbered dummy data pins, common electrode lines of the second virtual pixels are connected to the common pins, scanning lines of the third virtual pixels are connected to the even-numbered dummy data pins, data lines of the third virtual pixels are connected to the odd-numbered dummy data pins, common electrode lines of the third virtual pixels are connected to the common pins.

14. The display panel according to claim 7, wherein the virtual pixels comprise a first virtual pixel group and a second virtual pixel group being disposed respectively along edges of two long parallel sides of the display area, the first virtual pixel group and the second virtual pixel group comprise respectively a plurality of virtual pixels arranged in order, the virtual pixels of the first virtual pixel group share the same scanning line and are connected to the odd-numbered dummy scanning pins, the data lines of the virtual pixels located in the first virtual pixel group are connected respectively to the red data pins, the green data pins or the blue data pins, the common electrode lines of the virtual pixels located in the first virtual pixel group are connected to the common pins, a plurality of virtual pixels of the second virtual pixel group share the same scanning line and are connected to the even-numbered dummy scanning pins, the data lines of the virtual pixels located in the second virtual pixel group are connected respectively to the red data pins, the green data pins or the blue data pins, the common electrode lines of the virtual pixels located in the first virtual pixel group are connected to the common pins.

15. The display panel according to claim 7, wherein the virtual pixels comprise a third virtual pixel group and a forth virtual pixel group being disposed respectively along edges of two short parallel sides of the display area, the third virtual pixel group and the forth virtual pixel group comprise respectively a plurality of virtual pixels arranged in order, a plurality of virtual pixels of the third virtual pixel group share the same scanning line and are connected to the odd-numbered dummy scanning pins or the even-numbered dummy scanning pins, the data lines of the virtual pixels in the third virtual pixel group are connected to the even-numbered dummy data pins, the common electrode lines of the virtual pixels located in the third virtual pixel group are connected to the common pins, a plurality of virtual pixels of the forth virtual pixel group share the same scanning line and are connected to the odd-numbered dummy scanning pins or the even-numbered dummy scanning pins, the data lines of the virtual pixels located in the fourth virtual pixel group are connected to the even-numbered dummy data pins, the common electrode lines of the virtual pixels located in the fourth virtual pixel group are connected to the common pins.

* * * * *